United States Patent
Yeh et al.

(10) Patent No.: US 6,937,502 B2
(45) Date of Patent: Aug. 30, 2005

(54) RE-RECORDABLE DATA STORAGE MEDIUM UTILIZING CONDUCTION BARRIER

(75) Inventors: Bao-Sung Bruce Yeh, Corvallis, OR (US); Michael J. Regan, Corvallis, OR (US); Gary A. Gibson, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/617,900

(22) Filed: Jul. 10, 2003

(65) Prior Publication Data

US 2005/0006638 A1 Jan. 13, 2005

(51) Int. Cl.[7] .............................................. G11C 11/00
(52) U.S. Cl. ...................... 365/148; 365/180
(58) Field of Search ................. 365/148, 180, 365/100

(56) References Cited

U.S. PATENT DOCUMENTS

| | | | |
|---|---|---|---|
| 4,646,266 A | * | 2/1987 | Ovshinsky et al. ......... 365/105 |
| 5,049,461 A | * | 9/1991 | Arnett et al. ................... 430/5 |
| 5,557,596 A | | 9/1996 | Gibson et al. |
| 6,066,381 A | | 5/2000 | Cho et al. |
| 6,087,674 A | | 7/2000 | Ovshinsky et al. |
| 6,236,589 B1 | | 5/2001 | Gupta et al. |
| 6,243,348 B1 | | 6/2001 | Goodberlet |
| 6,274,463 B1 | | 8/2001 | Chaiken |
| 6,275,410 B1 | | 8/2001 | Morford |
| 2004/0086802 A1 | * | 5/2004 | Gibson .................. 430/270.13 |

* cited by examiner

Primary Examiner—Thong Q. Le

(57) ABSTRACT

A re-recordable data storage medium is disclosed. The medium in one embodiment includes a phase-changeable layer and an intermediate layer. A junction between the intermediate layer and another layer of the medium provides a conduction barrier under no illumination that is substantially diminished under illumination of the regions of the phase-changeable layer that are in the appropriate phase.

22 Claims, 6 Drawing Sheets

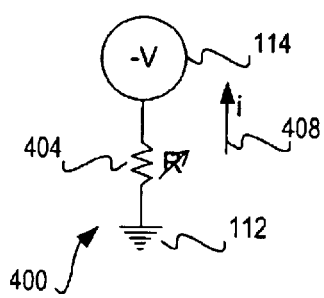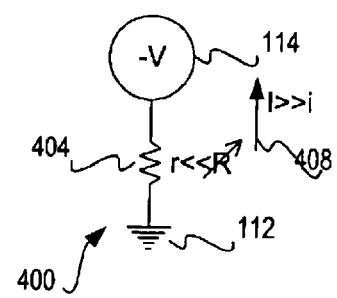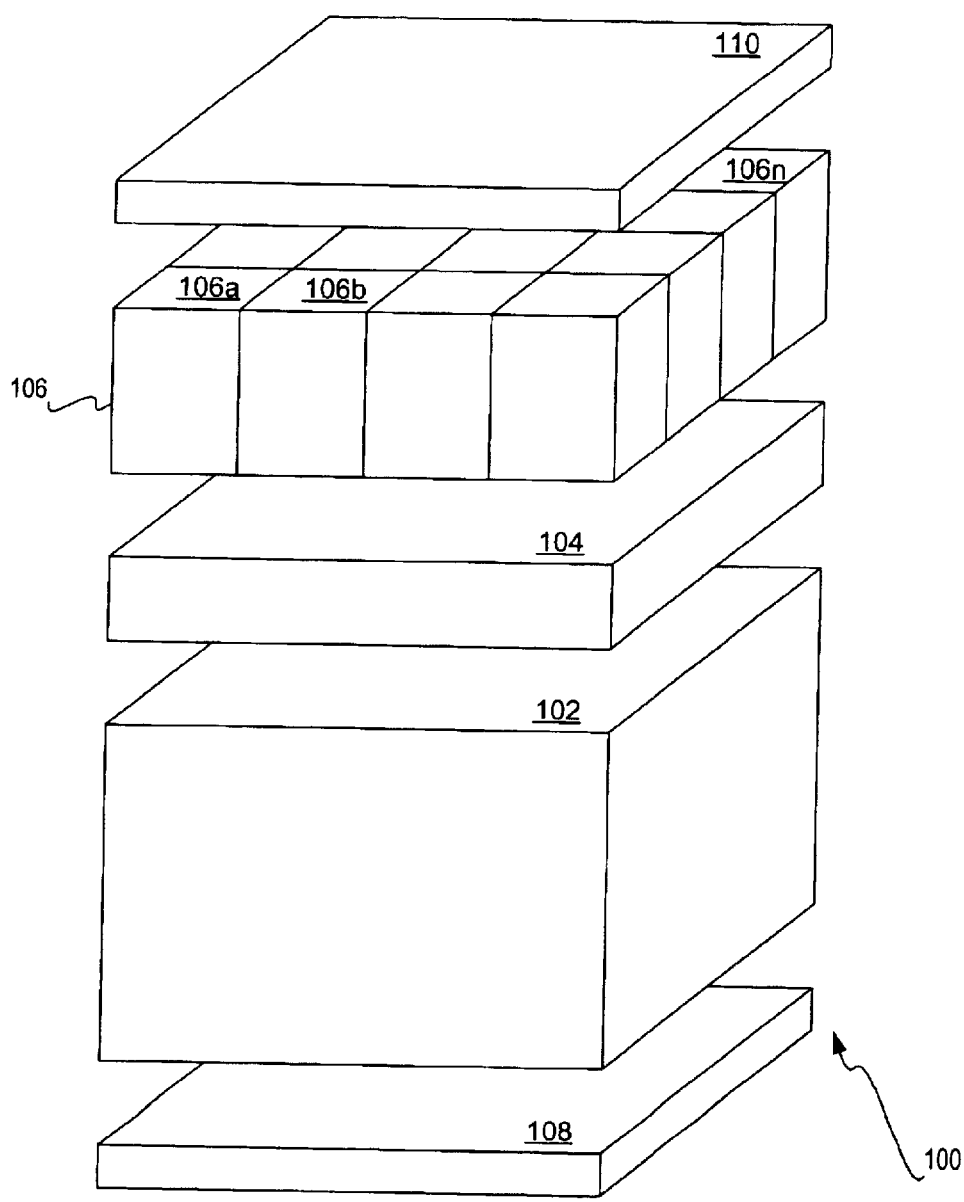

RE-RECORDABLE DATA STORAGE MEDIUM UTILIZING CONDUCTION BARRIER

BACKGROUND OF THE INVENTION

Storage media for computers and other types of electronic devices generally come in two types: volatile memory and non-volatile memory. Volatile memory loses its contents when power is no longer being supplied to the memory, whereas non-volatile memory maintains its contents even when power is not being supplied to the memory. The most common type of volatile memory is volatile random-access memory (RAM), which is most commonly available as and implemented as an integrated circuit (IC). The term data storage medium is used herein in a broad sense, and encompasses IC memory, as well as other types of data storage media.

By comparison, non-volatile memory has perhaps more commonly been available as and implemented as magnetic and optical media, including hard disk drives, floppy disks, compact disc read-only memories (CD-ROM's), CD re-writable (CD-RW) discs, and digital versatile discs (DVD's), among others. Historically, non-volatile memory implemented as an IC was primarily available as ROM that was not re-recordable, such as hard-wired ROM and programmable ROM (PROM). More recently, IC non-volatile memory has become available as various types of flash memory, which is more technically known as electrically erasable PROM (EEPROM).

IC-based data storage media is typically read from and, where applicable, written to, by directly using electric signals. By comparison, magnetic and optical data storage media is typically read from, and where applicable, written, to using magnetic sensors and optical sensors, where the latter usually include some type of illuminating beam. However, another type of data storage medium that can be implemented as an IC is read from and written to using an illuminating beam. A phase-changeable layer is present that can be switched between two or more different phases or states by being subjected to the illuminating beam. These phases or states correspond to different logical values, such as binary one and binary zero.

For reading the logical value stored in the phase-changeable layer, the medium is subjected to the illuminating beam at a low intensity. This induces current within the medium, which is then detected and correlated with the current phase of the re-recordable storage medium to determine the logical value stored in the medium. However, the current is relatively small, making it difficult to detect without error. Any present noise risks masking the current, as well as any material imperfections in the medium, which can cause erroneous logical values being read, affecting the accuracy of the medium as a data storage device.

For this and other reasons, therefore, there is a need for the present invention.

SUMMARY OF THE INVENTION

The invention relates to a re-recordable data storage medium. The medium in one embodiment includes a phase-changeable layer and an intermediate layer. A junction between the intermediate layer and another layer of the medium provides a conduction barrier under no illumination that is substantially diminished under illumination of the regions of the phase-changeable layer that are in the appropriate phase.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIGS. 3A and 3B are diagrams of circuits modeling a re-recordable data storage medium as a phototransistor, under no medium illumination and medium illumination, respectively, according to an embodiment of the invention.

FIG. 4 is a diagram of an exploded perspective view of a representative re-recordable data storage medium, according to an embodiment of the invention.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Conduction Barrier

Figure 1:
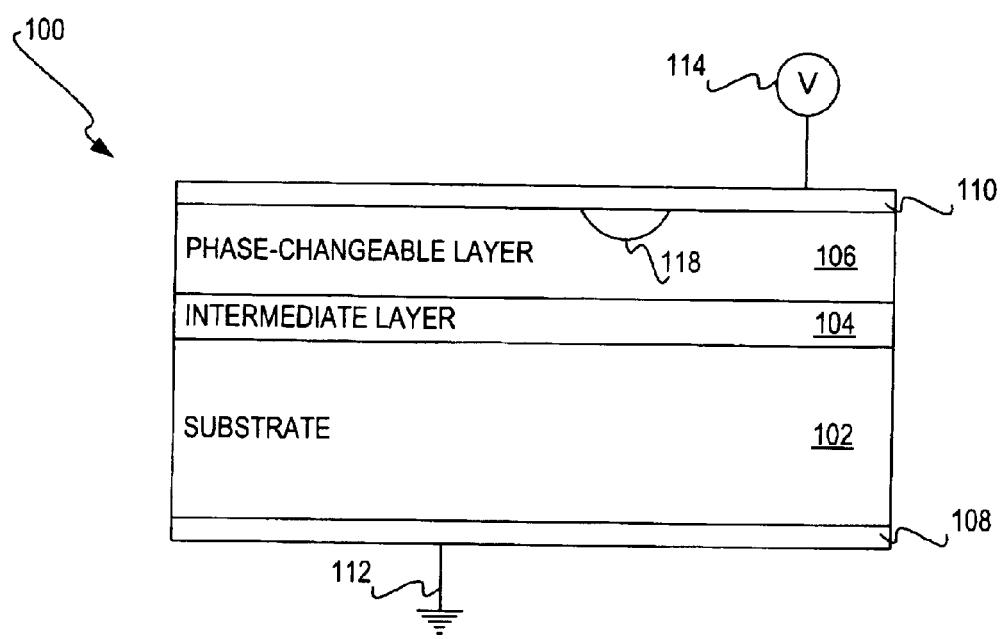
FIG. 1 is a diagram of a re-recordable data storage medium, according to an embodiment of the invention.

FIG. 1 shows a re-recordable data storage medium 100 according to an embodiment of the invention. The medium 100 includes a bottom contact 108, a substrate 102, an intermediate layer 104, a phase-changeable layer 106, and a top contact 110. The medium 100 may be an electronic device, such as an integrated circuit (IC). The bottom contact 108 is in one embodiment preferably connected to ground 112, whereas the top contact 110 is in one embodiment connected to a voltage source 114. More generally, the top contact 110 is biased relative to the bottom contact 108. The substrate 102 is referred to as such for descriptive convenience. However, in some embodiments of the invention, more than one film, such as three films, may be deposited on a lower-most layer that acts as a support and as a contact.

The phase-changeable layer 106 is the layer in which a logical value can be stored as data. The layer 106 has at least two phases. One phase corresponds to the layer 106 being crystalline, whereas another phase corresponds to the layer 106 being amorphous, or a different type of crystalline state.

When the medium 100 is locally subjected to a sufficiently intense illuminating beam with the appropriate pulse shape, such as an electron beam (e-beam) or a laser beam, the local phase of the layer 106 changes, indicating a change to the logical value stored at that position within the layer 106. For instance, one phase may correspond to a logical zero value, whereas the other phase may correspond to a logical one value.

Similarly, to read the logical value stored as data as the phase of the phase-changeable layer 106, an illuminating beam is shone on the re-recordable data storage medium 100. This can be the same beam as the beam used for writing, but the intensity is lower for reading the value stored within the layer 106 than it is for changing the value stored within the layer 106, so as not to induce changes in the stored data. The medium 100 may in actuality store a large number of logical values. As an example, the area 118 is specifically depicted as one such area that can store a logical value. The illuminating beam induces a current through the medium 100, which is subsequently detected and compared to two reference currents, one for each logical value that can be stored by the layer 106. That is, the current through the medium 100 varies depending on the local phase of the layer 106 in the interrogated region. In this manner, the value stored within the interrogated region of the layer 106 is determined.

Either the junction formed between the intermediate layer 104 and substrate 102, or the junction formed between the phase-changeable layer 106 and the intermediate layer 104, can act as a conduction barrier when the medium 100 is not subjected to illumination, limiting and substantially eliminating the current flowing through the medium 100 from the contact 110 to the contact 108. When the medium 100 is subjected to illumination, such as via an illuminating beam, the barrier junction conversely no longer acts as a conduction barrier if the illumination is incident upon a region of the phase-changeable layer that is in the appropriate state. That is, the conduction barrier is substantially diminished during illumination of phase-changed regions in one of the logical states of the storage medium. Current thus flows through the medium 100 from the contact 110 to the contact 108, with a magnitude depending on the local phase of the phase-changeable layer 106 in the region being addressed. The junctions may each be a homojunction or a heterojunction, as is more specifically described later in the detailed description. Which junction acts as the variable conduction barrier depends upon the bandgaps, electron affinities, thicknesses, and doping levels of the layers 102, 104, and 106.

Preferably, but not necessarily, the substrate 102 and the phase-changeable layer 106 are of one carrier type, whereas the intermediate layer 104 is of the opposite carrier type. For instance, both the materials 102 and 106 may be n-type, as known within the art, whereas the intermediate layer 104 may be p-type, as also known within the art. As a result, the intermediate layer 104 and the substrate 102 form a junction therebetween, which is a heterotype junction in the embodiment where the intermediate layer 104 and the substrate 102 have different carrier types. By comparison, if the intermediate layer 104 and the substrate 102 were of the same type, instead an isotype junction would be formed as the junction. Either type of junction can be used in an embodiment of the invention. The same holds true for the junction formed between layers 106 and 104.

It is noted that the type of carrier used is one aspect for properly designing the medium 100. More generally, the medium 100 is designed with an appropriate combination of layers, where each layer has an appropriate thickness, band gap, electronic affinity, and carrier concentration. Thus, the type of material used for the layers, and whether the junctions between the layers are heterojunctions or homojunctions, are as important in designing the medium 100 as the type of carrier employed.

Figure 2:
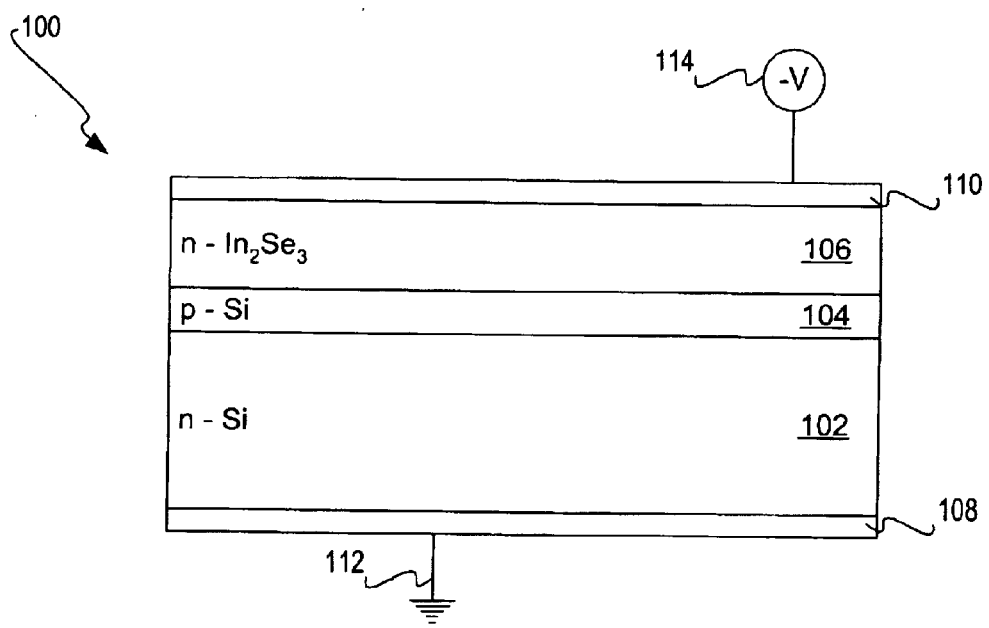
FIG. 2 is a diagram showing in more detail a re-recordable data storage medium, according to an embodiment of the invention.

FIG. 2 shows a more specific embodiment of the re-recordable data storage medium 100, according to an embodiment of the invention. The substrate 102 and the intermediate layer 104 are silicon, whereas the phase-changeable layer 106 is indium selenide, although the invention itself is not so limited. The substrate 102 and the phase-changeable layer 106 are n-type, such as resulting from n-type doping, for instance, whereas the intermediate layer 104 is p-type, such as resulting from p-type doping, for instance. The voltage source 114 is negative with respect to the voltage applied to the substrate contact 108. The medium 100 of the embodiment of FIG. 2 is thus an n-p-n device. Alternatively, the medium may be able to be a p-n-p device, as can be appreciated by those of ordinary skill within the art.

Phototransistor Modeling

FIGS. 3A and 3B show a representative circuit 400 modeling the re-recordable data storage medium 100 under no medium illumination and medium illumination of a crystalline region of the phase-changeable layer 106, respectively, according to an embodiment of the invention. The medium 100 is substantially modeled as a phototransistor 404. More generally, the medium is substantially modeled as an illumination-sensitive transistor. Depending upon the carrier types of the various layers, either the phase-changeable layer 106 acts as the phototransistor's source and the layer 102 acts as its collector, or the reverse. The intermediate layer 104 acts as a floating base, which is controlled via illumination of the phase-changeable layer 106 by either electrons or photons. In the case of illumination by electrons the device is more properly described as a cathodotransistor, such that the term illumination-sensitive transistor encompasses both a phototransistor and a cathodotransistor. The photo—or cathodotransistor 404 is active, or dynamic, in that the effective resistance between its source and collector can change because of a change in conditions, specifically a change from no medium illumination to medium illumination.

Without illumination, a barrier to the flow of majority carriers between the phase-changeable layer 106 and the layer 102 exists at either the 102/104 or 104/106 interface. For example, the device of FIG. 2 contains a barrier to the flow of electrons from the phase-changeable layer 106 to layer 102 at the 106/104 interface. This barrier is in the form of an increase in the energy of the conduction band in going from layer 106 to layer 104. When an illuminating beam is incident on the phase-changeable layer 106 it creates pairs of electrons and holes. If the recombination rate in the region where the carriers are created is sufficiently low, some of them can diffuse into the intermediate layer 104.

For example, in the device of FIG. 2, holes will diffuse to and collect in a potential well for holes in layer 104 formed by a maximum in the valence band. The resulting increased hole density in layer 104 will lower the energy of the conduction band in this layer and thereby lower the barrier to electron conduction at the 106/104 interface. Thus, during illumination of a crystalline region of the phase-changeable layer 106, the phototransistor 404 exhibits an effective change in resistance as compared to when the phototransistor 404 is not subject to illumination, as can be appreciated by those of ordinary skill within the art. There is current 408 flowing between the voltage source 114 and the contact 108, through the phototransistor 404 modeling the medium 100.

Furthermore, when the illuminating beam is incident upon an amorphous region, or a region in a different crystalline state with a higher recombination rate or lower mobility, fewer of the generated carriers survive to diffuse into the intermediate layer 104. Thus, the conduction barrier is not lowered as much as when the beam illuminates a crystalline region with a small recombination rate and high mobility, and the effective source-to-collector resistance remains relatively high. Note that one of the advantages of this device is that the illuminating beam need not penetrate to the intermediate layer 104 or bottom layer 102 to affect a change in the effective source-to-collector resistance. Consequently, low energy electrons or relatively high-energy photons with a short penetration depth in the phase-changeable layer 106 can be used for the read beam.

In FIG. 3A, under no medium illumination, the resistance of the phototransistor 404 is substantially great, such that the current 408 flowing between the voltage source 114 and the contact 108 is substantially small. The resistance of the phototransistor 404 in FIG. 3A is thus represented as R, and the current 408 is represented as i. In FIG. 3B, under medium illumination, the resistance of the phototransistor 404 is substantially small, such that the current 408 flowing between the voltage source 114 and the contact 108 is significantly great. The resistance of the phototransistor 404 in FIG. 3A is thus represented as r, where r<<R, and the current 408 is represented as I, where I>>i.

Representative Re-Recordable Data Storage Medium

The re-recordable data storage medium 100 as has been shown and described thus far is a single memory cell device, able to store a single logical value. However, that representation of the medium 100 is for illustrative clarity and is not an indication of the number of data values that the medium 100 would likely store in actuality. Therefore, FIG. 4 shows an exploded perspective of the medium 100 according to an embodiment of the invention in which many different data values can be stored. The medium 100 still includes the substrate 102, the intermediate layer 104, the phase-changeable layer 106, and the bottom and top contacts 108 and 110.

However, the phase-changeable layer 106 has been divided over two dimensions into a number of sub-portions 106a, 106b, . . . , 106n, each of which extends from the top surface of the layer 106 to the bottom surface of the layer 106. Each sub-portion of the layer 106 corresponds to an individual memory cell that can be placed in a phase independent of the phases stored by the cells to which the other sub-portions of the layer 106 correspond. Thus, each sub-portion of the layer 106 stores a logical value independent of the values stored by the other sub-portions of the layer 106. In varying embodiments of the invention, there may be thousands to billions or more of such sub-portions. Such sub-portions, or cells, do not have to be physically differentiated or separated in any way. For instance, the layer 106 can be a continuous, uniform layer of a phase-changeable material, with the cells defined as different locations on the layer.

Methods of Using

Figure 5A:
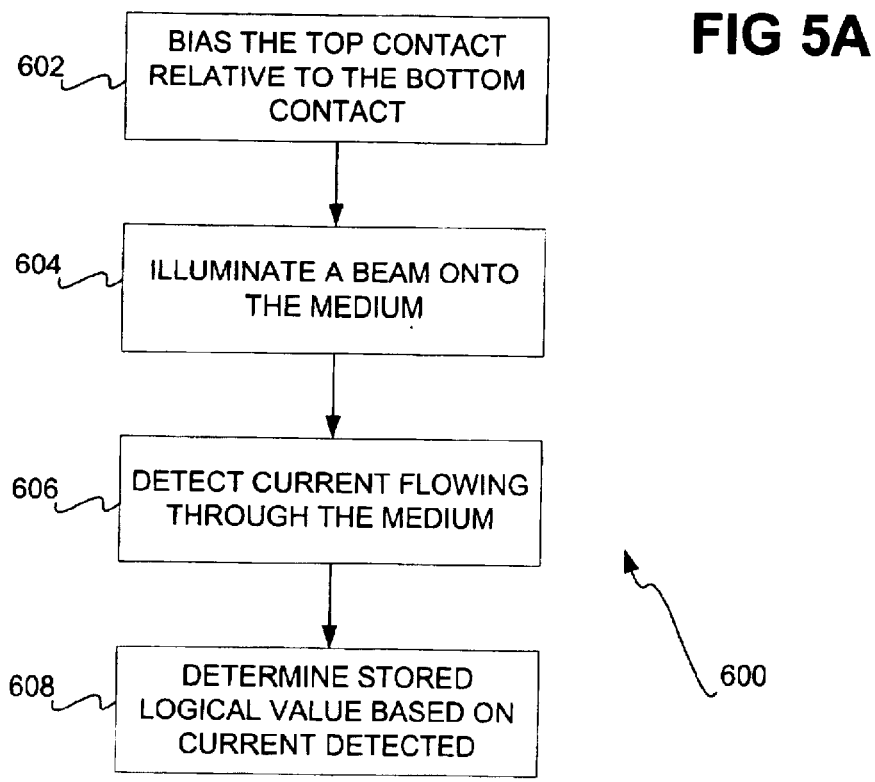
FIG. 5A is a flowchart of a method for reading the logical value currently stored as data by a re-recordable data storage medium, according to an embodiment of the invention.

FIG. 5A shows a method 600 for using the re-recordable data storage medium 100, according to an embodiment of the invention. First, the top contact 110 is biased with a voltage (602), such as by using the voltage source 114. The voltage preferably corresponds to the type of the phase-changeable layer 106 and the type of the substrate 102. Where the layers 102 and 106 are n-type, for example, this voltage is usually negative, and where the layers 102 and 106 are p-type, this voltage is typically positive.

A beam is then used to illuminate the medium 100 (604). The beam may be an e-beam, a laser beam, or another type of beam capable of generating electron-hole pairs in the medium 100. As has been described, this electron-hole pair generation causes carriers to collect within the intermediate layer 104, lowering the conduction barrier, and allowing current to flow through the medium 100. This current is detected (606).

The logical value stored within the phase-changeable layer 106 is finally determined based on the current flowing through the medium 100 that has been detected (608). As has been described, the current differs depending on the phase of the phase-changeable layer 106. Because the logical value stored within the layer 106 corresponds to the phase of the layer 106, determining the current flowing through the medium 100 allows the logical value stored within the layer 106 to also be determined.

Figure 5B:
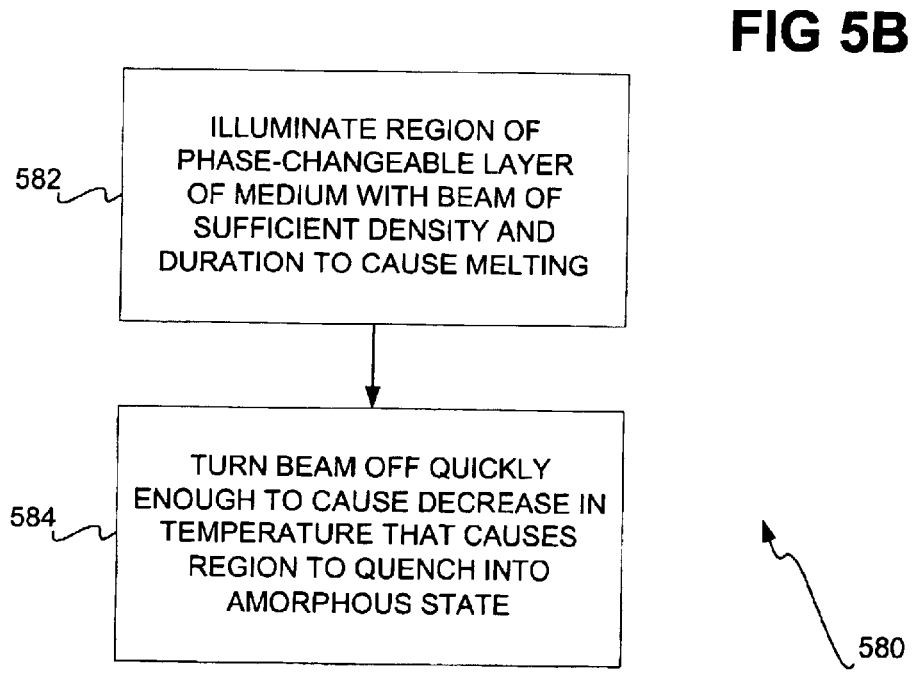
FIG. 5B is a flowchart of a method for amorphization of a crystallized region of a phase-changeable layer of a re-recordable data storage medium, according to an embodiment of the invention.

FIG. 5B shows a method 580 for changing the state, or phase, of a region of a phase-changeable layer from a crystalline state to an amorphous state, according to an embodiment of the invention. Where the crystalline state corresponds to one logical value, and the amorphous state corresponds to another logical value, the method 580 is thus for changing the value stored in the region of the phase-changeable layer. First, the region is illuminated with a beam of sufficient power density and for a sufficient duration to cause the region to be locally melted (582). That is, the region becomes amorphous. Next, the beam is turned off quickly enough to cause a decrease in temperature of the melted region sufficiently rapidly to quench the region, leaving the region in an amorphous state (584). That is, the temperature is quickly dropped below the crystallization temperature, before the region actually has a chance to recrystallize.

Figure 5C:
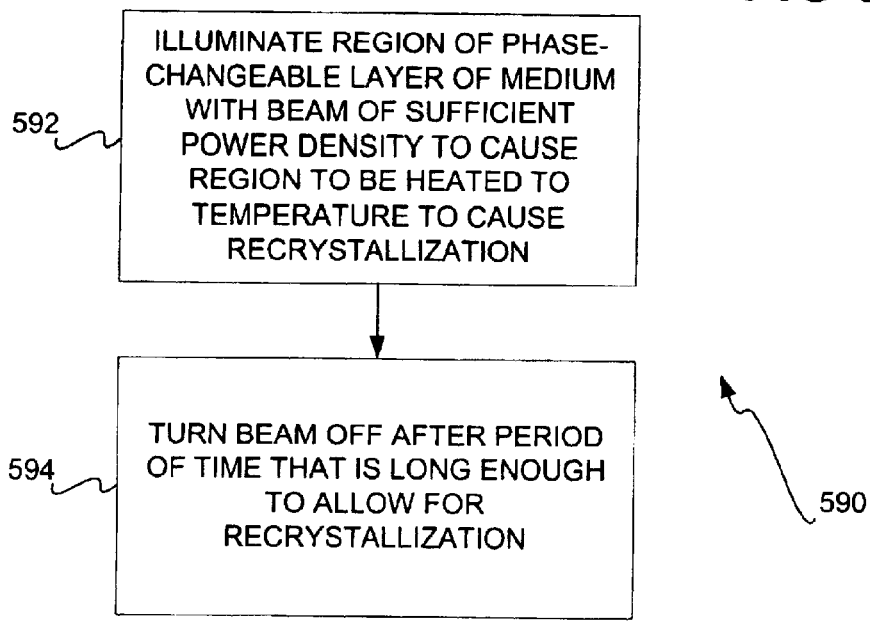
FIG. 5C is a flowchart of a method for crystallization of an amorphous region of a phase-changeable layer of a re-recordable data storage medium, according to an embodiment of the invention.

FIG. 5C shows a method 590 for changing the state, or phase, of a region of a phase-changeable layer from an amorphous state back to a crystalline state, according to an embodiment of the invention. Where the crystalline state corresponds to one logical value, and the amorphous state corresponds to another logical value, the method 590 is also for changing the value stored in the region of the phase-changeable layer. First, the region is illuminated with a beam of sufficient power density to cause the region to be heated to the crystallization temperature, but not heated to the greater, amorphization temperature (592). Next, the beam is turned off after a period of time that is long enough for recrystallization of the heated region (594). Thus, the region of the phase-changeable layer becomes crystalline again.

Method of Manufacture

Figure 6:
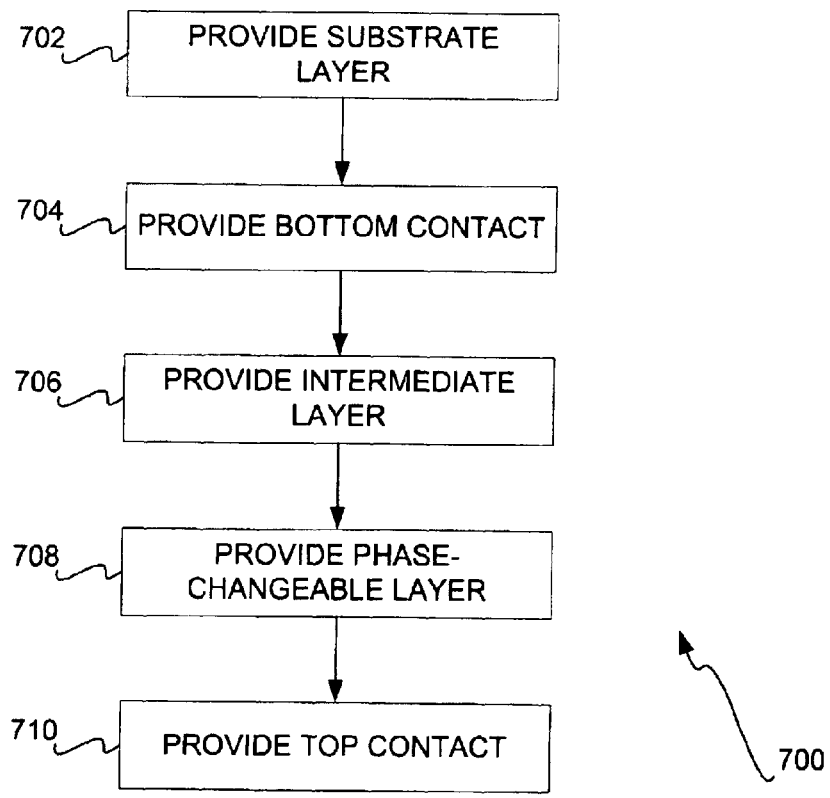
FIG. 6 is a flowchart of a method for constructing a re-recordable data storage medium, according to an embodiment of the invention.

FIG. 6 shows a method 700 for manufacturing the re-recordable data storage medium 100, according to an embodiment of the invention. That is, the medium 100 can be constructed by performing the method 700. The method 700 may be performed as a semiconductor fabrication process, to result in the medium 100 being an IC, as can be appreciated by those of ordinary skill within the art. First, the substrate 102 is provided (702), such as by starting with a silicon wafer. The bottom contact 108 is then provided (704). The contact 108 may be provided by depositing metal, for instance, and/or appropriately doping the substrate 102.

The intermediate layer 104 is provided on the substrate 102 (706). For instance, the silicon deposited or grown may be first deeply or completely doped according to the type of the substrate 102, so that the bottom part of the silicon provides the layer 102. The silicon may then be shallowly and partially doped according to the type of the intermediate layer 104, so that the top part of the silicon provides the layer 104. Alternatively, the intermediate layer 104 may be provided by depositing or growing additional silicon on the substrate 102, and then doping the silicon with its specified type, opposite to the type of the substrate 102. The phase-changeable layer is subsequently provided on the intermediate layer (708), such as by depositing or growing indium selenide, and finally the top contact is provided (710), such as by depositing metal.

It is noted that the top contact 110 is desirably made sufficiently permeable to the illuminating read beam so that an adequate fraction of the beam energy makes it through the active layers of the medium 100 for carrier generation. In the case of electrons, the penetration depth of the beam increases with beam energy, and is lower for lower-atomic number, lower-mass density materials. Thus, it is desirable to use a thin, low mass-density, low-atomic number material as the top contact 110. In the case of photons, the top contact 110 should be transparent to the wavelength of light used, or sufficiently thin that an appreciable fraction of the photons pass through without being absorbed. Alternatively, for both electrons and photons, the top contact 11 may not cover the entire top surface, such that a grid is formed as the top contact 110, and the uncovered areas are used for storage. In such a case, every part of the uncovered storage area should be sufficiently close to a portion of the top contact 110.

Furthermore, the top contact 110 is desirably able to withstand the write process. During amorphization, the phase-changeable layer 106 is temporarily molten, and neighboring portions of the top contact 110 also become hot. The contact 110 should not be destroyed by this heating, nor should it damage the underlying phase-changeable layer 106, by reacting or inter-diffusing with it. Furthermore, electrical contact should not be comprised, such as via delamination. Therefore, in one embodiment, a high-melting point refractory metal is used for the top contact 110. Alternatively, the top contact 110 may be a grid structure, as noted in the previous paragraph.

Mass Storage Device

Figure 7:
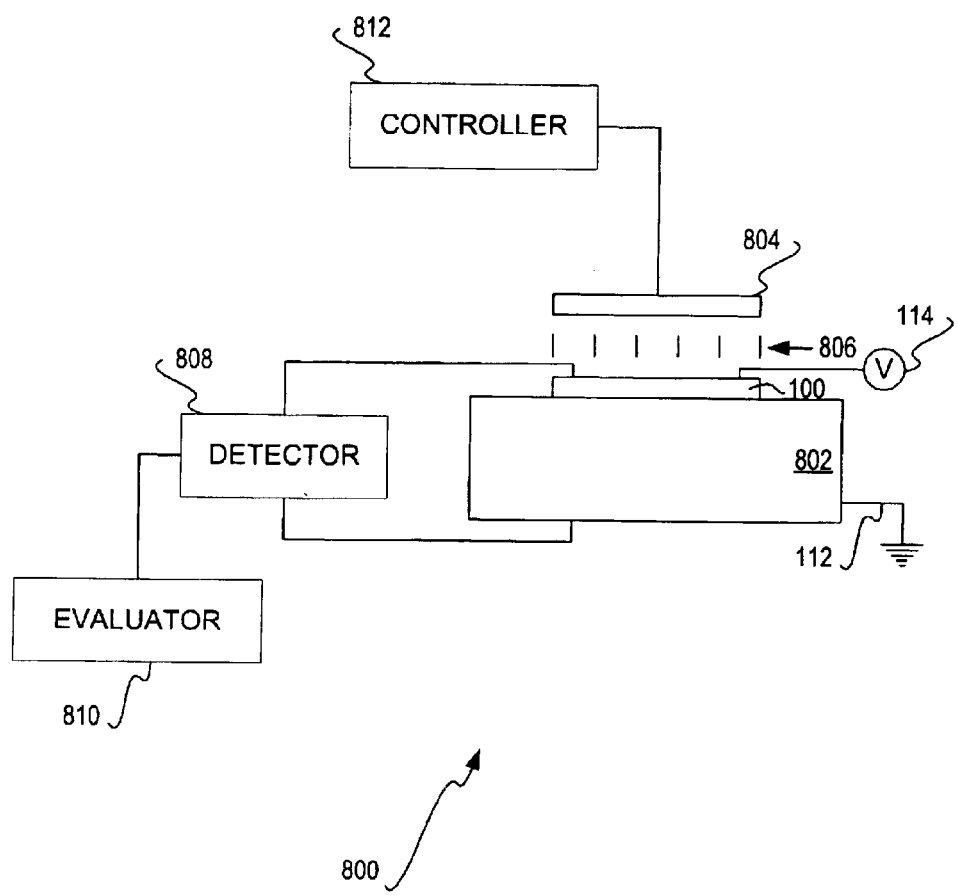
FIG. 7 is a diagram of a mass storage device, according to an embodiment of the invention.

FIG. 7 shows a diagram of a rudimentary mass storage device 800 that can be used to read data from and write data to the re-recordable data storage medium 100, according to an embodiment of the invention. The storage medium 100 specifically can be the embodiment of FIG. 4, where the medium 100 has a number of sub-portions that each can store its own data. The storage medium 100 is placed on a block 802 that is grounded to the ground 112. More generally, the block 802 is an instance of a mechanism that is receptive to the storage medium 100.

The block may also contain a micro-fabricated micro-mover that is used to scan the medium 100, in the plane of the medium, relative to read and write beams. Alternatively, emitters, or beam generators, could be placed on the micro-mover that is moved relative to the medium 100. The voltage source 114 is connected to the storage medium 100 as well. The voltage source 114 is depicted in FIG. 7 as being connected to the medium 100 for illustrative convenience. In actuality, in at least some embodiments, a detector may be floated to an appropriate voltage, or a bottom contact may be biased to an appropriate voltage relative to the phase-changeable layer. Thus, in one embodiment the bottom surface of the medium 100 is grounded, whereas the top surface of the medium 100 is biased.

An array of beam generators 804 is positioned over the medium 100, where each beam generator addresses one sub-portion of the medium 100 at a time. The array of beam generators 804 may be an electron field-emitter array, or another type of array, of beam generators. A controller 812 is able to selectively turn on and off individual beams of the array 804, at varying desired intensities. The detector 808 is able to detect the current flowing through the storage medium 100, if any, whereas the evaluator 810 correlates the current detected with reference current levels to determine the logical value being stored in a given sub-portion of the medium 100.

Operation of the mass storage device 800 is as follows. To change the value stored by a sub-portion of the medium 100, the controller 812 turns on the corresponding beam generator to generate a beam 806, at an intensity and time profile (or pulse shape) sufficient to change the phase of the phase-changeable layer of the sub-portion. To read the value stored by a sub-portion of the medium 100, the controller 812 again turns on the corresponding beam generator, but at a lower intensity level. The resulting beam 806 induces current within the medium 100 that is detected by the detector 808. The current induced depends on the phase of the phase-changeable layer of the sub-portion, and thus on the logical value stored in the sub-portion. The evaluator 810 correlates the detected current with this logical value.

The induced current depends upon the local state of the phase-changeable layer for a number of reasons. Usually, amorphous regions cause more rapid recombination of the generated electron-hole pairs, so that the carrier concentration within the intermediate layer is not changed as much, and the conduction barrier is not lowered as far. Furthermore, there may be differences within the built-in fields, interface barriers, carrier mobilities, and so on, resulting from amorphous versus crystalline bits that impact the current induced.

In addition, it is noted that each emitter, or beam generator, can be scanned, via a micro-fabricated micro-mover, so as to access many different sub-portions of the storage medium 100. It may be impractical to have one emitter for each bit position in the medium 100 when storing large amounts of data. In one embodiment, there may be thousands of emitters, each of which is able to read and write to millions of bit positions. These emitters can be distributed among tens of micro-movers, for the same medium 100, such that each micro-mover positions hundreds of emitters, in lock step, over a portion of the medium 100.

In such an embodiment, the medium 100 may be divided into electrically isolated blocks, with each block having its own read circuit, or being multiplexed to a read circuit that is used for a number of blocks. The number of isolated storage areas dictates the number of read emitters that can be simultaneously operated. In operation, each micro-mover is held to a given position, such that the emitters are used to read the bits over which they are positioned. Each of the bits read in parallel at a given time lies in a different electrically isolated storage position. As can be appreciated by those of ordinary skill within the art, different topologies of emitters, bits, read and/or write circuits, and micro-movers are also possible.

CONCLUSION

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

We claim:

1. A re-recordable data storage medium comprising:
   a phase-changeable layer having a plurality of phases, each phase corresponding to a different storable logical value; and,
   an intermediate layer, a junction between the intermediate layer and another layer of the medium providing a conduction barrier under no illumination that is substantially diminished under illumination of the regions of the phase-changeable layer that are in the appropriate phase.

2. The medium of claim 1, wherein the junction is between the intermediate layer and the phase-changeable layer.

3. The medium of claim 1, further comprising a substrate, and the junction is between the intermediate layer and the substrate.

4. The medium of claim 1, further comprising a top contact to the phase-changeable layer and a bottom contact.

5. The medium of claim 4, wherein the top contact is biased relative to the bottom contact.

6. The medium of claim 1, wherein the junction between the intermediate layer and the other layer provides a first resistance between the top and bottom layers under no illumination and a second resistance under illumination of the regions of the phase-changeable layer that are in the appropriate phase less than the first resistance.

7. The medium of claim 1, wherein the phase-changeable layer comprises a plurality of phase-changeable sub-portions, each sub-portion having a plurality of phases, each phase corresponding to a different storable logical value independent of other of the plurality of sub-portions.

8. The medium of claim 1, wherein a first phase of the plurality of phases corresponds to the phase-changeable layer being crystalline, and a second phase of the plurality of phases corresponds to the phase-changeable layer being amorphous.

9. The medium of claim 1, wherein the medium is at least one of an electronic device and an integrated circuit (IC).

10. A re-recordable data storage medium comprising:

a phase-changeable layer having a first phase corresponding to a first storable logical value and a second phase corresponding to a second storable logical value; and, a plurality of layers including the phase-changeable layer and acting as a illumination-sensitive transistor having a first resistance under no illumination and a second resistance under illumination of the regions of the phase-changeable layer that are in the appropriate phase that is substantially less than the first resistance.

11. The medium of claim 10, where the plurality of layers comprises, in addition to the phase-changeable layer, an intermediate layer, and a bottom one or more layers.

12. The medium of claim 11, wherein the intermediate layer and the phase-changeable layer define a junction acting as a conduction barrier under no illumination that is substantially diminished under illumination of the regions of the phase-changeable layer that are in the appropriate phase.

13. The medium of claim 11, wherein the intermediate layer and one of the bottom one or more layers define a junction acting as a conduction barrier under no illumination that is substantially diminished under illumination of the regions of the phase-changeable layer that are in the appropriate phase.

14. The medium of claim 10, wherein the phase-changeable layer comprises a plurality of phase-changeable sub-portions, each sub-portion having a changeable phase as one of the first phase and the second phase independent of other of the plurality of sub-portions.

15. A re-recordable data storage medium comprising:

first means for repeatedly storing a data value selected from a first logical value and a second logical value; and, second means for providing a conduction barrier under no illumination that is substantially diminished under illumination of the regions of the first means.

16. A method comprising:

illuminating a beam on a re-recordable data storage medium having a phase-changeable layer having a phase indicative of a stored logical value and a first layer and a second layer defining a junction with the phase-changeable layer that has a lowered conduction barrier resulting from illumination of the beam onto regions of the phase-changeable layer that are in an appropriate phase;

detecting current flowing through the re-recordable data storage medium; and, determining the stored logical value based on the current flowing through the re-recordable data storage medium as detected.

17. The method of claim 16, wherein the beam illuminating the storage medium comprises one of an electron beam and a laser beam.

18. The method of claim 16, wherein detecting the current flowing through the re-recordable data storage medium comprises detecting the current as one of substantially a first current corresponding to a first phase of the phase-changeable layer indicating a first stored logical value, and a second current corresponding to a second phase of the phase-changeable layer indicating a second stored logical value.

19. The method of claim 18, wherein determining the stored logical value comprises one of determining the stored logical value as the first stored logical value based on detecting the first current, and as the second stored logical value based on detecting the second current.

20. A mass-storage device comprising:

a first mechanism receptive to a re-recordable data storage medium having a conduction barrier having a resistance that is substantially decreasable upon illumination and a phase-changeable layer having a plurality of sub-portions, each sub-portion having a phase indicative of a stored logical value;

an array of beam generators, each corresponding to at least one of the plurality of sub-portions of the medium, each beam generator capable of generating an illuminating beam at a first level to reduce the resistance of the conduction barrier layer to induce current flow through the corresponding sub-portion of the medium; and, a second mechanism to detect the current flow induced through a currently illuminated sub-portion of the medium and to correlate the current flow detected with the stored logical value of the currently illuminated sub-portion.

21. The device of claim 20, further comprising a voltage source to bias the medium.

22. The device of claim 20, wherein the second mechanism comprises a detector to detect the current flow induced through the currently illuminated sub-portion of the medium and an evaluator to correlate the current flow detected with the stored logical value of the currently illuminated sub-portion.

* * * * *